(12) United States Patent
Yamamoto et al.

(10) Patent No.: US 8,759,953 B2
(45) Date of Patent: Jun. 24, 2014

(54) ELECTRONIC COMPONENT INCLUDING A SHIELDING METAL FILM DISPOSED ON A RESIN LAYER

(75) Inventors: Yuki Yamamoto, Otsu (JP); Jun Harada, Yasu (JP); Hiroshi Takagi, Otsu (JP); Katsuro Hirayama, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 979 days.

(21) Appl. No.: 11/461,855

(22) Filed: Aug. 2, 2006

(65) Prior Publication Data
US 2006/0267159 A1  Nov. 30, 2006

Related U.S. Application Data

(63) Continuation of application No. PCT/JP2004/018469, filed on Dec. 10, 2004.

(30) Foreign Application Priority Data

Feb. 13, 2004 (JP) .................................. 2004-037541
Apr. 13, 2004 (JP) .................................. 2004-117471

(51) Int. Cl.
*H01L 23/552* (2006.01)

(52) U.S. Cl.
USPC ........... 257/659; 257/700; 257/723; 257/724; 257/777

(58) Field of Classification Search
CPC .............. H01L 23/3121; H01L 23/552; H01L 25/0655; H01L 2224/16; H01L 2924/01004; H01L 2924/01078; H01L 2924/19041; H01L 2924/19106; H01L 2924/3025; H01L 2224/16225

USPC ................. 257/659, 700, 723, 724, 730, 777; 25/659

See application file for complete search history.

(56) References Cited

U.S. PATENT DOCUMENTS 4,939,568 A  *  7/1990  Kato et al. ..................... 257/686
5,068,708 A  *  11/1991  Newman ....................... 257/668

(Continued)

FOREIGN PATENT DOCUMENTS

JP   07-307574 A   11/1995
JP   08-186192 A    7/1996

(Continued)

OTHER PUBLICATIONS

International Search Report issued in corresponding International Application No. PCT/JP2004/018469, mailed on Mar. 22, 2005.

(Continued)

*Primary Examiner* — Ori Nadav
(74) *Attorney, Agent, or Firm* — Keating & Bennett, LLP

(57) ABSTRACT

In an electronic component, an active chip element and a passive chip element are respectively enclosed within first and second resin layers, which are separately disposed on upper and lower surfaces of a core substrate, respectively. The first resin layer includes a shielding metal film disposed on an upper surface thereof and a first via-hole conductor which connects the shielding metal film with a circuit pattern provided on the core substrate. The second resin layer includes an external-terminal electrode disposed on a lower surface thereof and a second via-hole conductor which connects the external-terminal electrode with a circuit pattern provided on the core substrate.

11 Claims, 2 Drawing Sheets

(56) References Cited

U.S. PATENT DOCUMENTS

| | | | |
|---|---|---|---|
| 5,422,514 A | 6/1995 | Griswold et al. | |
| 6,072,122 A | 6/2000 | Hosoya | |
| 6,163,456 A * | 12/2000 | Suzuki et al. | 361/704 |
| 6,794,747 B2 * | 9/2004 | Takehara et al. | 257/705 |
| 6,818,974 B2 * | 11/2004 | Yokoyama et al. | 257/676 |
| 7,023,073 B2 * | 4/2006 | Mano | 257/659 |
| 7,023,706 B2 * | 4/2006 | Negishi et al. | 361/783 |
| 2003/0165052 A1 | 9/2003 | Negishi et al. | |
| 2004/0026777 A1 | 2/2004 | Yokoyama et al. | |

FOREIGN PATENT DOCUMENTS

| | | |
|---|---|---|
| JP | 09-219588 A | 8/1997 |
| JP | 11-054927 A | 2/1999 |
| JP | 11-340367 A | 12/1999 |
| JP | 2000-012769 A | 1/2000 |
| JP | 2000-223647 A | 8/2000 |
| JP | 2001-217542 A | 8/2001 |
| JP | 2002-33419 A | 1/2002 |
| JP | 2002-111222 A | 4/2002 |
| JP | 2002-203938 A | 7/2002 |
| JP | 2003-007367 A | 1/2003 |
| JP | 2003-078244 A | 3/2003 |
| JP | 2003-124435 A | 4/2003 |
| JP | 2003-188538 A | 7/2003 |
| JP | 2003-197849 A | 7/2003 |
| JP | 2003-258192 A | 9/2003 |
| JP | 2003-309213 A | 10/2003 |

OTHER PUBLICATIONS

Official communication issued in counterpart Chinese Application No. 2004800415432, mailed on Jun. 13, 2008.

\* cited by examiner

ELECTRONIC COMPONENT INCLUDING A SHIELDING METAL FILM DISPOSED ON A RESIN LAYER

BACKGROUND OF THE INVENTION

1. Field of the Invention

The present invention relates to an electronic component having an active element and a passive element that are resin-sealed to a substrate, and to a method for manufacturing the same. In particular, the present invention relates to an electronic component that is highly reliable both electrically and structurally, and to a method for manufacturing the same.

2. Description of the Related Art

As a conventional electronic component of this type, a high-frequency semiconductor device disclosed in Japanese Unexamined Patent Application Publication No. 2003-124435 (Patent Document 1), and a high-frequency module and method for manufacturing the high-frequency module disclosed in Japanese Unexamined Patent Application Publication No. 2002-033419 (Patent Document 2) are known.

In the high-frequency semiconductor device according to Patent Document 1, a composite resin material layer composed of epoxy resin and an inorganic filler is provided on a lower surface of a ceramic substrate. A lower portion of the composite resin material layer is flat and is provided with an external-connection-terminal electrode. The composite resin material layer has implanted therein semiconductor elements and passive elements, which are connected to the ceramic substrate. Accordingly, as an all-in-one module package of a send/receive system, the high-frequency semiconductor device achieves compactness and high-density packaging.

On the other hand, the high-frequency module according to Patent Document 2 is provided with a high-frequency circuit portion including electronic elements disposed on a substrate, and a shielding film for electromagnetically shielding the high-frequency circuit portion. The high-frequency module is also provided with a resin mold layer within which the electronic elements are enclosed. The shielding film is a metallic film disposed on a surface of the resin mold layer. Thus, a designated shielding member is not necessary.

In Patent Documents 1 and 2 described above, active elements, such as semiconductor elements and integrated circuit chips, and passive elements, such as capacitors and resistors, are all disposed on one side of a ceramic substrate such that the active elements and the passive elements are enclosed within a resin layer.

However, the conventional electronic component, such as the high-frequency semiconductor device and the high-frequency module, is problematic in that electromagnetic mutual interference occurs between the active elements and the passive elements because the active elements and the passive elements are all disposed within the resin layer on one side of the ceramic substrate. Moreover, in the conventional technology, the active elements and the passive elements disposed on the ceramic substrate are set within the resin layer by heat curing a thermosetting resin material. This produces a significant change in the volume of the resin layer with respect to the ceramic substrate before and after the heat curing process, thus increasing a possibility of, for example, delamination between the ceramic substrate and the resin layer. Even if such delamination is not produced, the significant change in volume may cause structural defects in the ceramic substrate, such as cracks and breakages.

SUMMARY OF THE INVENTION

To overcome the problems described above, preferred embodiments of the present invention provide a highly reliable electronic component in which electromagnetic mutual interference is prevented between an active element and a passive element and in which structural defects, such as delamination, are prevented, and also provide a method for manufacturing such an electronic component.

An electronic component according to a preferred embodiment of the present invention includes a core substrate having a first main surface and a second main surface opposite to the first main surface, the first main surface including at least one active element disposed thereon, the second main surface including a passive element disposed thereon, and first and second resin layers respectively disposed on the first main surface and the second main surface of the core substrate such that the at least one active element and the passive element are respectively enclosed within the first and second resin layers. The first resin layer includes a shielding metal film disposed on an upper surface thereof and a first via-hole conductor disposed therein which connects the shielding metal film with a circuit pattern provided on the first main surface. The second resin layer includes an external-terminal electrode disposed on a lower surface thereof and a second via-hole conductor disposed therein which connects the external-terminal electrode with a circuit pattern provided on the second main surface.

The at least one active element preferably includes a plurality of active elements, the active elements having the first via-hole conductor interposed therebetween.

Furthermore, each of the shielding metal film and the external-terminal electrode is preferably made of a metallic foil.

The core substrate is preferably defined by a multilayer resin substrate.

A method for manufacturing an electronic component according to another preferred embodiment of the present invention includes the steps of setting first resin and second resin respectively on opposite surfaces of the core substrate included in the electronic component, and thermo-compression bonding the first resin and the second resin simultaneously onto the core substrate so as to form the first resin layer and the second resin layer respectively on the opposite surfaces of the core substrate.

Preferably, the method further includes a step for setting a metallic foil on a surface of the first resin opposite to a surface thereof that is adjacent to the core substrate, and a step for setting a metallic foil on a surface of the second resin opposite to a surface thereof that is adjacent to the core substrate.

Accordingly, preferred embodiments of the present invention provide a highly reliable electronic component in which electromagnetic mutual interference is prevented between an active element and a passive element and in which structural defects, such as delamination, are prevented, and a method for manufacturing such an electronic component.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 2A is a cross-sectional view showing a state where active elements and passive elements are set on a core substrate, FIG. 2B is a cross-sectional view showing a state where resin layers are pressure-bonded to the core substrate shown in FIG. 2A, and FIG. 2C is a cross-sectional view showing a finished product of the electronic component provided with via-hole conductors.

DETAILED DESCRIPTION OF PREFERRED EMBODIMENTS

Figure 1:
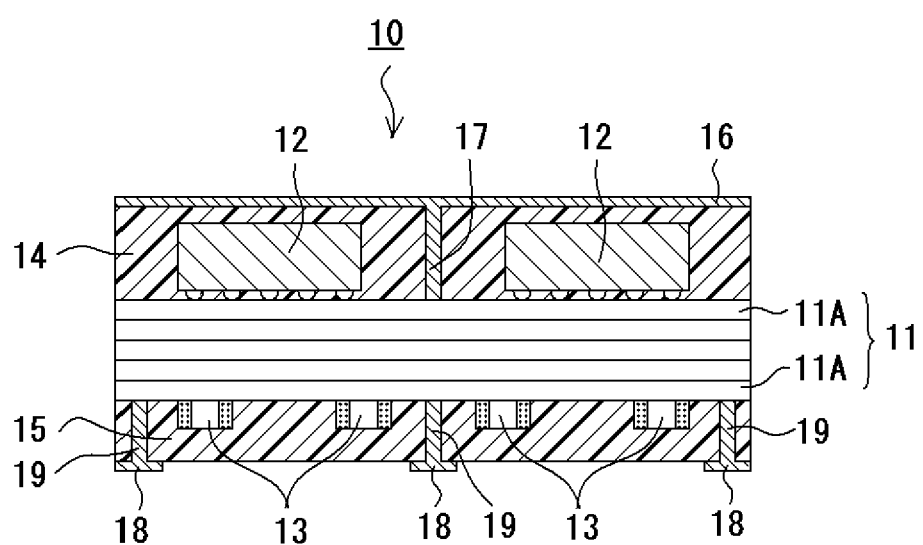
FIG. 1 is a cross-sectional view of an electronic component according to a preferred embodiment of the present invention.
Figure 2A:
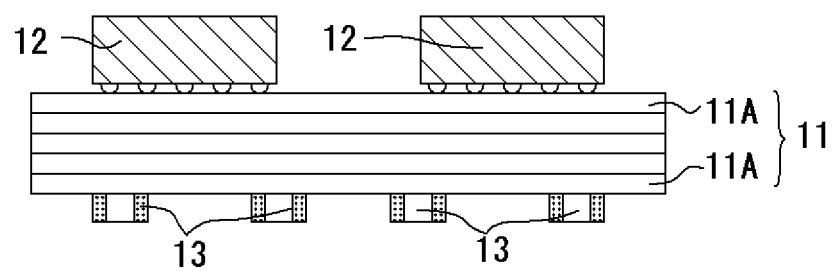
FIGS. 2A-2C illustrate a relevant portion in a method for manufacturing the electronic component according to a preferred embodiment of the present invention.
Figure 2B:
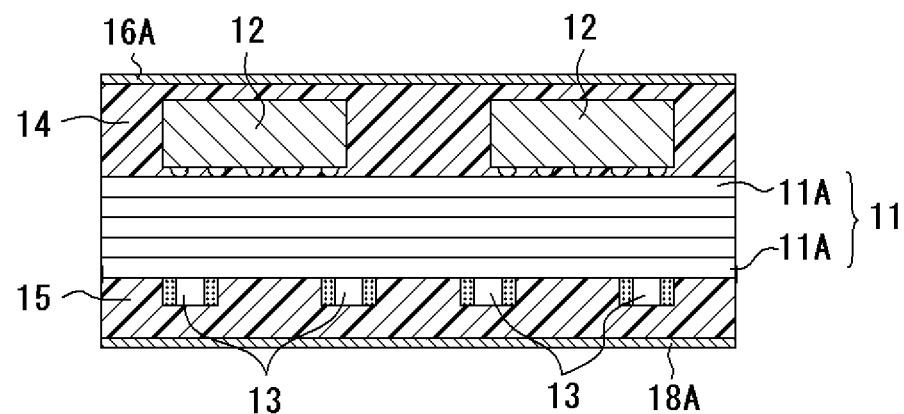
Figure 2C:
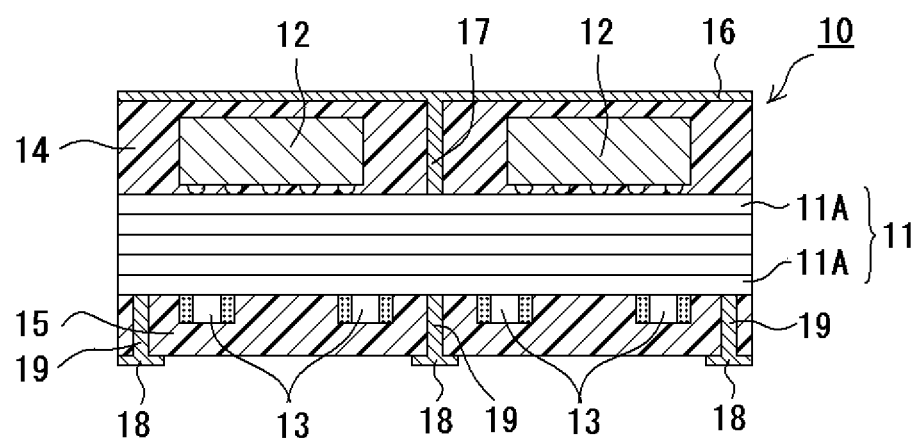

The present invention will now be described first with reference to a preferred embodiment shown in FIG. 1. FIG. 1 is a cross-sectional view of an electronic component according to a preferred embodiment of the present invention. FIGS. 2A-2C illustrate a relevant portion in a method for manufacturing the electronic component according to a preferred embodiment of the present invention, FIG. 2A is a cross-sectional view showing a state where active elements and passive elements are set on a core substrate, FIG. 2B is a cross-sectional view showing a state where resin layers are pressure-bonded to the core substrate shown in FIG. 2A, and FIG. 2C is a cross-sectional view showing a finished product of the electronic component provided with via-hole conductors.

For example, referring to FIG. 1, an electronic component 10 according to the present preferred embodiment includes a core substrate 11 including a multilayer resin substrate having a plurality of resin layers 11A, a plurality of active chip elements 12, such as semiconductor elements, disposed at predetermined locations in a circuit pattern (not shown) provided on a first main surface (upper surface) of the core substrate 11, a plurality of passive chip elements 13, such as capacitors, inductors, and resistors, disposed at predetermined locations in a circuit pattern (not shown) provided on a second main surface (lower surface) of the core substrate 11. Accordingly, the active chip elements 12 and the passive chip elements 13 are disposed separately on the upper and lower surfaces of the core substrate 11, respectively, such that no passive chip elements 13 is disposed on the first main surface of the core substrate 11 and no active chip elements 12 is disposed on the second main surface of the core substrate 11, thereby preventing electromagnetic mutual interference between the active chip elements 12 and the passive chip elements 13.

The resin layers 11A of the core substrate 11 each include a circuit pattern (not shown). The circuit patterns of the upper and lower resin layers 11A are connected to each other through a via-hole conductor (not shown). Each of the resin layers 11A is preferably composed of, for example, a commonly known synthetic resin material, such as an epoxy resin material.

The upper surface of the core substrate 11 has a first resin layer 14 adhered thereto. The plurality of active chip elements 12 disposed on the upper surface of the core substrate 11 is enclosed within the first resin layer 14. The lower surface of the core substrate 11 has a second resin layer 15 adhered thereto. The plurality of passive chip elements 13 disposed on the lower surface of the core substrate 11 is enclosed within the second resin layer 15. The first and second resin layers 14, 15 include an inorganic compound, such as silica, mixed therein as a filler so as to increase the thermal conductivity of the first and second resin layers 14, 15. The resin material defining the resin layers 14, 15 may be the same synthetic resin material used for the resin layers 11A of the core substrate 11 or may be a different synthetic resin material therefrom. Furthermore, the core substrate 11 may similarly include a filler mixed therein.

Because the core substrate 11 is preferably composed of a synthetic resin material and the first and second resin layers 14, 15 are preferably composed of a synthetic resin material including an inorganic filler, there is substantially no difference in thermal expansion or at most a small difference in thermal expansion between the core substrate 11 and the first and second resin layers 14, 15. Consequently, this substantially prevents delamination from occurring between the core substrate 11 and the first and second resin layers 14, 15. Moreover, the core substrate 11 is prevented from being damaged, and the boundary surfaces are prevented from cracking due to contraction caused by heat curing of the first and second resin layers 14, 15.

Furthermore, an upper surface of the first resin layer 14 has a shielding metal film 16 of a predetermined circuit pattern disposed thereon. The shielding metal film 16 electromagnetically shields the first resin layer 14 from the outside. Moreover, the first resin layer 14 is also provided with first via-hole conductors 17 arranged in a predetermined pattern and extend vertically through the first resin layer 14. Each of the first via-hole conductors 17 is disposed adjacent to the active chip elements 12 and connects the shielding metal film 16 to the circuit pattern (for example, a ground electrode) on the upper surface of the core substrate 11. Each via-hole conductor 17 is preferably, for example, circular or elliptical in lateral (horizontal) cross section. The via-hole conductors 17 substantially prevent electromagnetic mutual interference from occurring between adjacent the active chip elements 12. The interposition of the first via-hole conductors 17 between the active chip elements 12 enables high-density packaging of the active chip elements 12, which thus enables a size reduction of the electronic component 10.

A lower surface of the second resin layer 15 is provided with a plurality of external-terminal electrodes 18 disposed at various locations in a predetermined pattern. The external-terminal electrodes 18 function as input-output terminals. Moreover, the second resin layer 15 is also provided with second via-hole conductors 19, arranged in a predetermined pattern and extending vertically through the second resin layer 15. The second via-hole conductors 19 connect the external-terminal electrodes 18 to the circuit pattern on the lower surface of the core substrate 11. Each second via-hole conductor 19 is arranged adjacent to the passive chip elements 13 so as to enable high-density packaging of the passive chip elements 13, thus enable a size reduction of the electronic component 10.

The shielding metal film 16 and the external-terminal electrodes 18 are each preferably made of a metallic foil having a low resistance, such as an electrolytic copper foil, for example. The attachment surfaces between the metallic foils and the resin layers are preliminarily roughened. In addition, the attachment surfaces are surface treated, such as a silane coupling treatment, an excimer laser treatment, a corona discharge treatment, and a blackening treatment, so as to enhance adhesion for the shielding metal film 16 and the external-terminal electrodes 18. Accordingly, the shielding metal film 16 is securely attached to the first resin layer 14 so as to be substantially inseparable from the first resin layer 14. Similarly, the external-terminal electrodes 18 are securely attached to the second resin layer 15 so as to be substantially inseparable from the second resin layer 15.

Each of the first and second via-hole conductors 17, 19 is preferably made of a conductive metallic material, such as copper, which is deposited in a corresponding via hole by plating. Specifically, each of the via-hole conductors 17, 19 may be formed by filling the corresponding via hole with a conductive metallic material, or may be formed by coating only the surface of the corresponding via hole with a conductive metallic material. The via-hole conductors 17, 19 may alternatively be formed using conductive paste, but it is more preferable that the via-hole conductors 17, 19 be formed by plating in view of electrical reliability and shock resistant property.

The core substrate 11 may be made of a multilayer ceramic substrate instead of a multilayer resin substrate. In this case, the boundary surfaces between the core substrate 11 and the first and second resin layer 14, 15 may each be provided with an electrode (not shown) that occupies about 1% to about 10% of the surface area of the core substrate 11. In order to form these electrodes, the multilayer ceramic substrate, which is used as the core substrate 11, is preferably sintered together with conductive paste. The sintering of the conductive paste produces a grain growth in metallic particles and allows, for example, organic binders to disappear, by which the electrode surfaces can be roughened. This inhibits or prevents delamination between the core substrate 11, i.e. the multilayer ceramic substrate, and the first and second resin layers 14, 15. The electrodes may be connected to the circuit patterns of the core substrate 11, or may be independent of the circuit patterns.

As described above, according to this preferred embodiment, the active chip elements 12 and the passive chip elements 13 are respectively enclosed within the first and second resin layers 14, 15, which are separately disposed on the upper and lower surfaces of the core substrate 11, thereby preventing electromagnetic mutual interference between the active chip elements 12 and the passive chip elements 13. Moreover, since the shielding metal film 16 on the upper surface of the first resin layer 14 electromagnetically shields the active chip elements 12 in the first resin layer 14 from the outside, the active chip elements 12 are efficiently protected from external noise. In addition, since the first via-hole conductors 17 that connect the shielding metal film 16 to the circuit pattern disposed on the upper surface of the core substrate 11 are each interposed between adjacent active chip elements 12, the electromagnetic mutual interference between the active chip elements 12 is prevented by the first via-hole conductors 17. Furthermore, the interposition of the second via-hole conductors 19 between the passive chip elements 13 prevents mutual interference between the passive chip elements 13, thereby preventing degradation in the performance thereof.

Generally, the active chip elements have similar sizes or the passive chip elements have similar sizes. Therefore, unlike a situation in which the active chip elements and the passive chip elements are mixed within the same layer, the arrangement of the active chip elements 12 and the passive chip elements 13 separately within the respective first and second resin layers 14, 15 achieves a uniform height in the plurality of active chip elements 12 and a uniform height in the plurality of passive chip elements 13. In contrast to the case where the chip elements 12, 13 are mixed in the same layer, the thicknesses of the first and second resin layers 14, 15 are reduced.

Furthermore, because a multilayer resin substrate is used as the core substrate 11, the first and second resin layers 14, 15 have good chemistry. Thus, delamination, for example, between the core substrate 11 and the first and second resin layers 14, 15 is inhibited or prevented even in response to contraction caused by heat curing of the first and second resin layers 14, 15. Accordingly, this reduces an incidence rate of delamination when a drop test is performed, which is required for, for example, portable phones, thereby enhancing the shock resistant property. Furthermore, because the shielding metal film 16 and the external-terminal electrodes 18 are formed as flat electrodes using metallic foils, a low resistance value is obtained. In addition, since the electrodes can be formed simply by pressure bonding the metallic foils, the shielding metal film 16 and the external-terminal electrodes 18 are manufactured at low cost. Furthermore, because the first and second via-hole conductors 17, 19 are each formed by plating using a conductive metallic material, the resistance of the via-hole conductors 17, 19 is reduced. Thus, a contact force (connectivity) with respect to the circuit pattern on the upper surface of the core substrate 11 is increased, thereby further improving the shock resistant property. Accordingly, this prevents or inhibits, for example, a connection failure, which may be caused by an impact force.

Alternatively, if the core substrate 11 is formed using a multilayer ceramic substrate, the electrodes may be formed simultaneously on the upper and lower surfaces of the multilayer ceramic substrate. Thus, the electrode surfaces can be roughened, thereby inhibiting delamination between the core substrate 11, i.e. the multilayer ceramic substrate, and the first and second resin layers 14, 15.

Accordingly, this preferred embodiment provides a highly reliable electronic component 10 in which electromagnetic mutual interference is prevented between the active chip elements 12 and the passive chip elements 13 and in which structural defects, such as delamination, are prevented.

A method for manufacturing the electronic component according to a preferred embodiment of the present invention will now be described with reference to FIGS. 2A-2C. In order to manufacture the electronic component 10, the core substrate 11, the active chip elements 12, and the passive chip elements 13 are first prepared. Subsequently, referring to FIG. 2A, the active chip elements 12 and the passive chip elements 13 are mounted at predetermined locations in the circuit patterns provided on the upper and lower surfaces of the core substrate 11, respectively. Although FIGS. 2A-2C show a process for forming a single electronic component 10, in an actual process, a mother substrate of the core substrate 11 is prepared, and a plurality of electronic components 10 is formed simultaneously from the mother substrate.

Subsequently, a first resin having a predetermined thickness and composed of a thermosetting resin material including an inorganic filler is disposed on the upper side of the core substrate 11. Moreover, an electrolytic copper foil is placed over the upper surface of the first resin such that a roughened surface of the foil faces the first resin. At the same time, second resin having a predetermined thickness and composed of a thermosetting resin material including an inorganic filler is disposed on the lower side of the core substrate 11. Moreover, an electrolytic copper foil is placed over the lower surface of the second resin such that a roughened surface of the foil faces the second resin. Alternatively, a sheet having an electrolytic copper foil and the first resin attached thereto and a sheet having an electrolytic copper foil and the second resin attached thereto may be disposed respectively on the upper and lower sides of the core substrate 11.

The first resin and the second resin disposed respectively on the upper and lower sides of the core substrate 11 are heated under vacuum at about 180° C. for about 60 minutes. While being given a pressure of about 0.5 MPa, the first resin and the second resin, together with the electrolytic copper foils thereof, are thermo-compression bonded to the upper and lower surfaces of the core substrate 11, respectively, whereby the first and second resin layers 14, 15 are formed. The active chip elements 12 are embedded into the first resin layer 14 and the passive chip elements 13 are embedded into the second resin layer 15. The first and second resin layers 14, 15 are then heat cured. As a result, a metal film 16A is formed on the upper surface of the first resin layer 14, and a metal film 18A is formed on the lower surface of the second resin layer 15, as shown in FIG. 2B.

Subsequently, using photolithography and etching techniques, the metal films 16A, 18A of the first and second resin layers 14, 15 are patterned into predetermined circuit configurations, thereby forming circuit patterns. Accordingly, the shielding metal film 16 is formed from the metal film 16A disposed on the first resin layer 14, and the external-terminal electrodes 18 are formed from the metal film 18A disposed on the second resin layer 15.

Subsequently, a $CO_2$ laser is emitted to predetermined sections of the first and second resin layers 14, 15 so as to form via holes. Each of the via holes has a bottom and extends to the circuit pattern on the upper or lower surface of the core substrate 11. The inside of the via holes is given a de-smear treatment, and the via holes are then filled with copper metal by electroless copper plating and electrolytic copper plating in that order so as to form the first and second via-hole conductors 17, 19. Thus, referring to FIG. 2C, the shielding metal film 16 and the circuit pattern on the upper surface of the core substrate 11 are electrically connected to each other, and moreover, the external-terminal electrodes 18, the circuit pattern on the lower surface of the core substrate 11, and the circuit patterns on the core substrate are electrically connected to each other. The shielding metal film 16 and the external-terminal electrodes 18 are again patterned into a predetermined circuit configuration and are then given a rust-proof treatment. Subsequently, the mother substrate is diced such that a plurality of the electronic components 10 is obtained.

As described above, this preferred embodiment includes a step for setting the first and second resin layers 14, 15 respectively on the upper and lower sides of the core substrate 11, and a step for thermo-compression bonding the first and second resin layers 14, 15 simultaneously onto the upper and lower surfaces of the core substrate 11, respectively. Therefore, the active chip elements 12 and the passive chip elements 13 disposed on the core substrate 11 are heated simultaneously within the respective first and second resin layers 14, 15, which means that there is no temperature difference between the active chip elements 12 and the passive chip elements 13. Consequently, there is no difference in thermal expansion or contraction between the upper surface and the lower surface of the core substrate 11, thereby effectively preventing the active chip elements 12 and the passive chip elements 13 from separating from the core substrate 11.

Furthermore, when forming the first and second via-hole conductors 17, 19, since each via hole has a bottom, the first and second via-hole conductors 17, 19 can be properly formed by plating, even if an aspect ratio of the via holes is increased. In addition, the first and second via-hole conductors 17, 19 have good connectivity with respect to the circuit patterns formed on the upper and lower surfaces of the core substrate 11 and have a high shock resistant property and low resistance, whereby an electronic component 10 with high electrical reliability is achieved. As reliability tests for the electronic component 10, a thermo cycle test (−40° C.×30 minutes→85° C.×30 minutes, 1000 cycles), a constant-temperature-and-humidity test (85° C. and RH 85% for 1000 hours), and a high-temperature life test (125° C. for 1000 hours) were used, and moreover, a drop test (dropped from 1.8 m) was used as a shock-resistant test. The results of the reliability tests showed that there was substantially no change in the resistance values of the first and second via-hole conductors 17, 19 before and after each test. The result of the shock-resistant test showed that there was no occurrence of connection failure in the first and second via-hole conductors 17, 19. In a case where the via holes having a bottom have a high aspect ratio, it is difficult to fill the via holes with conductive paste, and even if the filling of the paste into the holes is successful, the via-hole conductors have a high resistance in comparison to those formed by plating.

The present invention is suitable for manufacturing an electronic component used in a mobile communication device, such as a portable phone, for example.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An electronic component comprising:
a core substrate having a first main surface and a second main surface opposite to the first main surface, the first main surface having at least one active chip element disposed thereon, the second main surface having at least one passive chip element disposed thereon;
first and second resin layers respectively disposed directly on the first main surface and the second main surface of the core substrate such that the at least one active chip element and the at least one passive chip element are respectively enclosed within the first and second resin layers;
a shielding metal film disposed directly on and extending over substantially an entire upper surface of the first resin layer; and
an external-terminal electrode disposed on a lower surface of the second resin layer; wherein
the first resin layer includes a first via-hole conductor which connects the shielding metal film with a circuit pattern provided on the first main surface of the core substrate;
the second resin layer includes a second via-hole conductor which connects the external-terminal electrode with another circuit pattern provided on the second main surface of the core substrate; and
no passive chip element is disposed on the first main surface and no active chip element is disposed on the second main surface.

2. The electronic component according to claim 1, wherein said at least one active chip element comprises a plurality of active chip elements, and the first via-hole conductor interposed between the plurality of active chip elements.

3. The electronic component according to claim 1, wherein the shielding metal film and the external-terminal electrode are each made of a metallic foil.

4. The electronic component according to claim 1, wherein the core substrate comprises a multilayer resin substrate.

5. The electronic component according to claim 1, wherein the first and second resin layers are made of epoxy resin.

6. The electronic component according to claim 1, wherein the at least one active chip element is a semiconductor element.

7. The electronic component according to claim 1, wherein the at least one passive chip element is at least one of a capacitor, an inductor, and a resistor.

8. The electronic component according to claim 1, wherein the core substrate, the first resin layer and the second resin layer are made of the same resin material.

9. The electronic component according to claim 1, wherein the shielding metal film is made of an electrolytic copper foil.

10. The electronic component according to claim 1, wherein the external-terminal electrode is made of an electrolytic copper film.

11. The electronic component according to claim 1, wherein the first and second via-hole conductors are made of copper.

* * * * *